(12) United States Patent
Liu et al.

(10) Patent No.: US 12,471,320 B2
(45) Date of Patent: Nov. 11, 2025

(54) THIN FILM TRANSISTOR AND DISPLAY PANEL

(71) Applicant: BOE TECHNOLOGY GROUP CO., LTD., Beijing (CN)

(72) Inventors: Fengjuan Liu, Beijing (CN); Jianye Zhang, Beijing (CN); Yuhang Lu, Beijing (CN); Hongda Sun, Beijing (CN); Pan Xu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/024,990

(22) PCT Filed: Mar. 31, 2022

(86) PCT No.: PCT/CN2022/084425
§ 371 (c)(1),
(2) Date: Mar. 7, 2023

(87) PCT Pub. No.: WO2023/184345
PCT Pub. Date: Oct. 5, 2023

(65) Prior Publication Data
US 2024/0282862 A1    Aug. 22, 2024

(51) Int. Cl.
*H10D 30/67* (2025.01)
(52) U.S. Cl.
CPC ..... *H10D 30/6755* (2025.01); *H10D 30/6733* (2025.01)

(58) Field of Classification Search
CPC .......... H10D 30/6755; H10D 30/6733; H10D 30/67; H10D 30/673; H10D 30/6757
See application file for complete search history.

(56) References Cited

U.S. PATENT DOCUMENTS

| 6,111,296 A | 8/2000 | Yamazaki et al. |
| 6,184,556 B1 | 2/2001 | Yamazaki et al. |
| 2021/0367081 A1* | 11/2021 | Yan ..................... H10D 30/6757 |

FOREIGN PATENT DOCUMENTS

| CN | 101060083 A | 10/2007 |
| GB | 2460395 A | 12/2009 |

* cited by examiner

*Primary Examiner* — Mohammad A Rahman
(74) *Attorney, Agent, or Firm* — HOUTTEMAN LAW LLC

(57) ABSTRACT

A thin film transistor including: a base substrate, and an active layer and a gate on the base substrate, where the active layer includes a first part and a second part, a conductivity of the second part is greater than a conductivity of the first part; an orthographic projection of the gate on the base substrate covers an orthographic projection of the first part on the base substrate, and the orthographic projection of the gate on the base substrate does not overlap an orthographic projection of the second part on the base substrate; and the first part includes a plurality of first sub-parts, and two sides of any one first sub-part in a trend direction of the active layer are each connected to the second part.

20 Claims, 6 Drawing Sheets

| Sample number | Ion | Loading time 0s | Loading time 100s | Loading time 200s | Loading time 300s | Loading time 600s | Loading time 1200s | Loading time 3600s | Loading time 7200s | ΔVth |
|---|---|---|---|---|---|---|---|---|---|---|
| ① | 26.8uA | 0.65 | 0.80 | 0.83 | 0.84 | 0.90 | 1.01 | 1.15 | 1.27 | 0.62 |
| ② | 26.2uA | 0.84 | 0.87 | 0.88 | 0.88 | 0.90 | 0.92 | 0.97 | 1.03 | 0.19 |
| ③ | 27.0uA | 0.30 | 0.31 | 0.31 | 0.32 | 0.32 | 0.33 | 0.36 | 0.40 | 0.10 |
FIG. 7
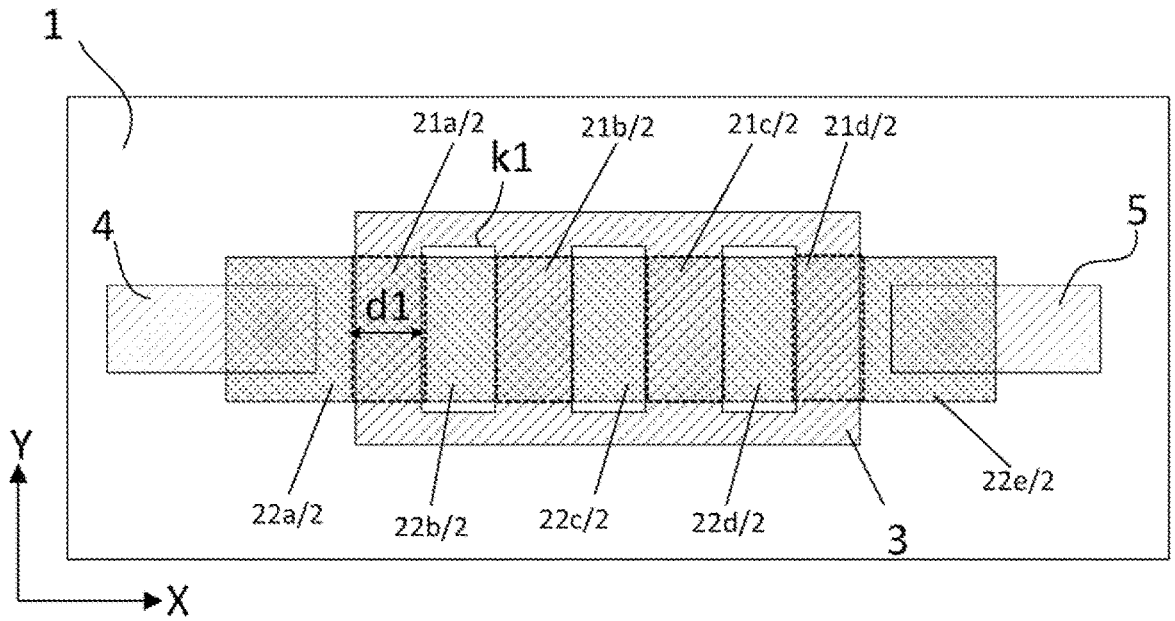
FIG. 8
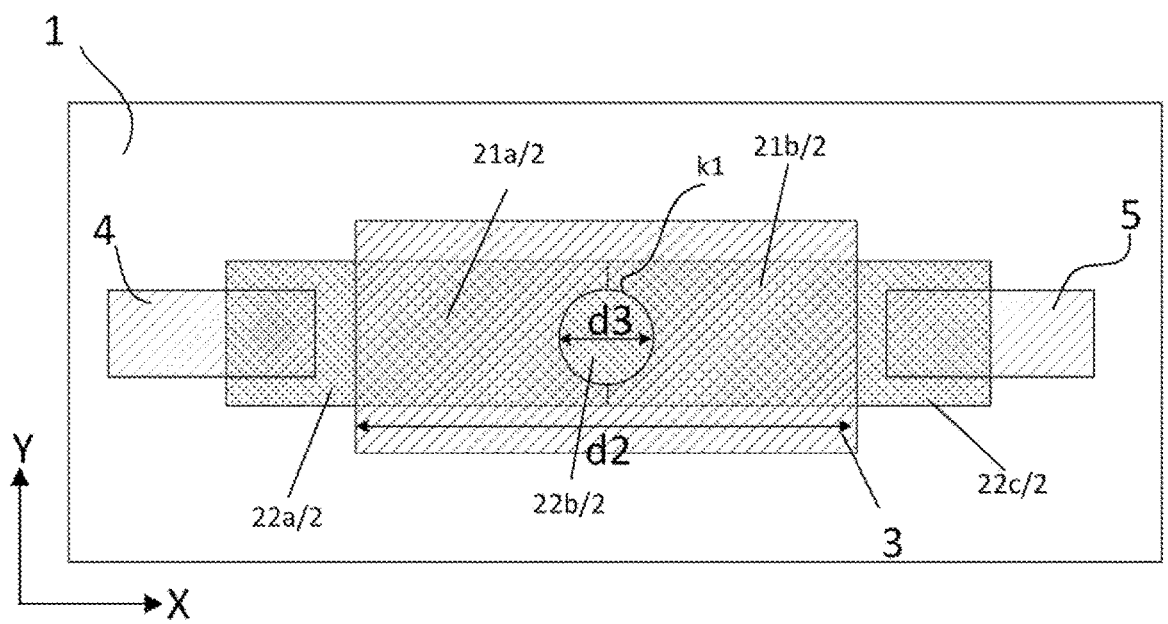
FIG. 9

THIN FILM TRANSISTOR AND DISPLAY PANEL

TECHNICAL FIELD

The present disclosure belongs to the field of display technology, and particularly relates to a thin film transistor and a display panel.

BACKGROUND

At present, a display panel includes different types of thin film transistors such as a switching thin film transistor, a driving thin film transistor, a gate integrated circuit transistor, and the like. Generally, the lengths of channel regions of the various types of thin film transistors are different, and it is difficult to unify uniformity and stability of characteristics of the thin film transistor with a longer channel region. For example, the longer the channel region is, the more stable the threshold voltage is, but the lower the positive bias temperature stability is, which affects the performance of the thin film transistor.

SUMMARY

The present disclosure aims to solve at least one technical problem in the prior art and provides a thin film transistor and a display panel, which can ensure the thin film transistor to have good uniformity and stability of characteristics.

In a first aspect, a solution to the technical problem according to the present disclosure is a thin film transistor, including: a base substrate, and an active layer and a gate on the base substrate,
  where the active layer includes a first part and a second part, a conductivity of the second part is greater than a conductivity of the first part; an orthographic projection of the gate on the base substrate covers an orthographic projection of the first part on the base substrate, and the orthographic projection of the gate on the base substrate does not overlap an orthographic projection of the second part on the base substrate; and
  the first part includes a plurality of first sub-parts, and two sides of any one of the plurality of first sub-parts in a trend direction of the active layer are each connected to the second part.

In some examples, the second part includes a plurality of second sub-parts; and both sides of any one of the plurality of first sub-parts in the trend direction of the active layer are each connected to a corresponding one of the plurality of second sub-parts.

In some examples, the plurality of first sub-parts and the plurality of second sub-parts are alternately arranged and interconnected along the trend direction of the active layer, and each of two sub-parts respectively at the head and the tail along the trend direction of the active layer is the second sub-part.

In some examples, the active layer extends in a first direction; the gate includes at least two sub-gates arranged at intervals along the first direction, and
  a part of the active layer in a region of an orthographic projection of each of the at least two sub-gates on the active layer is a corresponding one of the plurality of first sub-parts; a part of the active layer in a region between any two adjacent first sub-parts is a corresponding one of the plurality of second sub-parts; and two sides of any one of the plurality of first sub-parts in the first direction are each connected to a corresponding one of the plurality of second sub-parts.

In some examples, the gate further includes a connection electrode, and one end of each of the at least two sub-gates is connected to the connection electrode; an orthographic projection of the connection electrode on the base substrate does not overlap the orthographic projection of the active layer on the base substrate,
  where the connection electrode extends along the first direction, the at least two sub-gates extend along a second direction, and the first direction intersects with the second direction.

In some examples, the gate is provided with at least one hollowed-out part, and a part of the active layer in a region of an orthographic projection of each of the at least one hollowed-out part on the active layer is a corresponding one of the plurality of second sub-parts, and two sides of this second sub-part in the trend direction of the active layer are connected to corresponding two of the first sub-parts, respectively.

In some examples, the active layer extends in a first direction; the gate is provided with a plurality of hollowed-out parts arranged at intervals along the first direction, a part of the active layer in a region of an orthographic projection of each of the plurality of hollowed-out parts on the active layer is a corresponding one of the plurality of second sub-parts, and two sides of this second sub-part in the trend direction of the active layer are each connected to a corresponding one of the plurality of first sub-parts.

In some examples, a distance between any two adjacent ones of the plurality of hollowed-out parts is the same, and/or an orthographic projection of each of the plurality of hollowed-out parts on the base substrate has a same shape and a same area.

In some examples, the plurality of first sub-parts are arranged at intervals along a second direction, and the plurality of first sub-parts extend along a first direction, and the first direction intersects with the second direction; and
  the plurality of second sub-parts include a first group of second sub-parts and a second group of second sub-parts, on two sides of the plurality of first sub-parts in the first direction, respectively; each second sub-part in the first group of second sub-parts is connected to a first side of a corresponding one of plurality of first sub-parts, and each second sub-part in the second group of second sub-parts is connected to a second side of a corresponding one of the plurality of first sub-parts.

In some examples, the plurality of first sub-parts and the plurality of second sub-parts are connected together, to form a zigzag shape.

In some examples, orthographic projections of the plurality of first sub-parts on the base substrate have a same shape and a same area, and/or a distance between any two adjacent first sub-parts of the plurality of first sub-parts is the same.

In some examples, orthographic projections of the plurality of second sub-parts on the base substrate have a same shape and a same area, and/or a distance between any two adjacent second sub-parts of the plurality of second sub-parts is the same.

In some examples, the plurality of first parts and the plurality of second parts have a one-piece structure.

In some examples, the active layer is a metal oxide active layer.

In some examples, the thin film transistor further includes a source and a drain on the base substrate, where the source and the drain are in a same layer, and are in a different layer from the active layer and the gate; and the source and the drain are each connected to the second part.

In a second aspect, the present disclosure further provides a display panel including the above thin film transistor.

In the thin film transistor and the display panel according to the present disclosure, since the first part of the active layer located in the channel region is divided into a plurality of first sub-parts, the length of the channel region of the thin film transistor and the display panel is not affected, and therefore the thin film transistor and the display panel have original stability. Moreover, since each of the first sub-parts is connected to the second part of the active layer located in the conductorized region, so that carriers in the second parts can be uniformly diffused into the plurality of first sub-parts, the difference between carrier concentrations at various positions of the first part is lower, and the characteristic uniformity of the thin film transistor is ensured.

BRIEF DESCRIPTION OF DRAWINGS

FIG. 7 is a table showing variations of threshold voltages of thin film transistors.

FIG. 8 is a schematic diagram illustrating a structure of a thin film transistor according to a second embodiment of the present disclosure.

FIG. 9 is a schematic diagram illustrating a structure of another thin film transistor according to a second embodiment of the present disclosure.

DETAIL DESCRIPTION OF EMBODIMENTS

Figure 1:
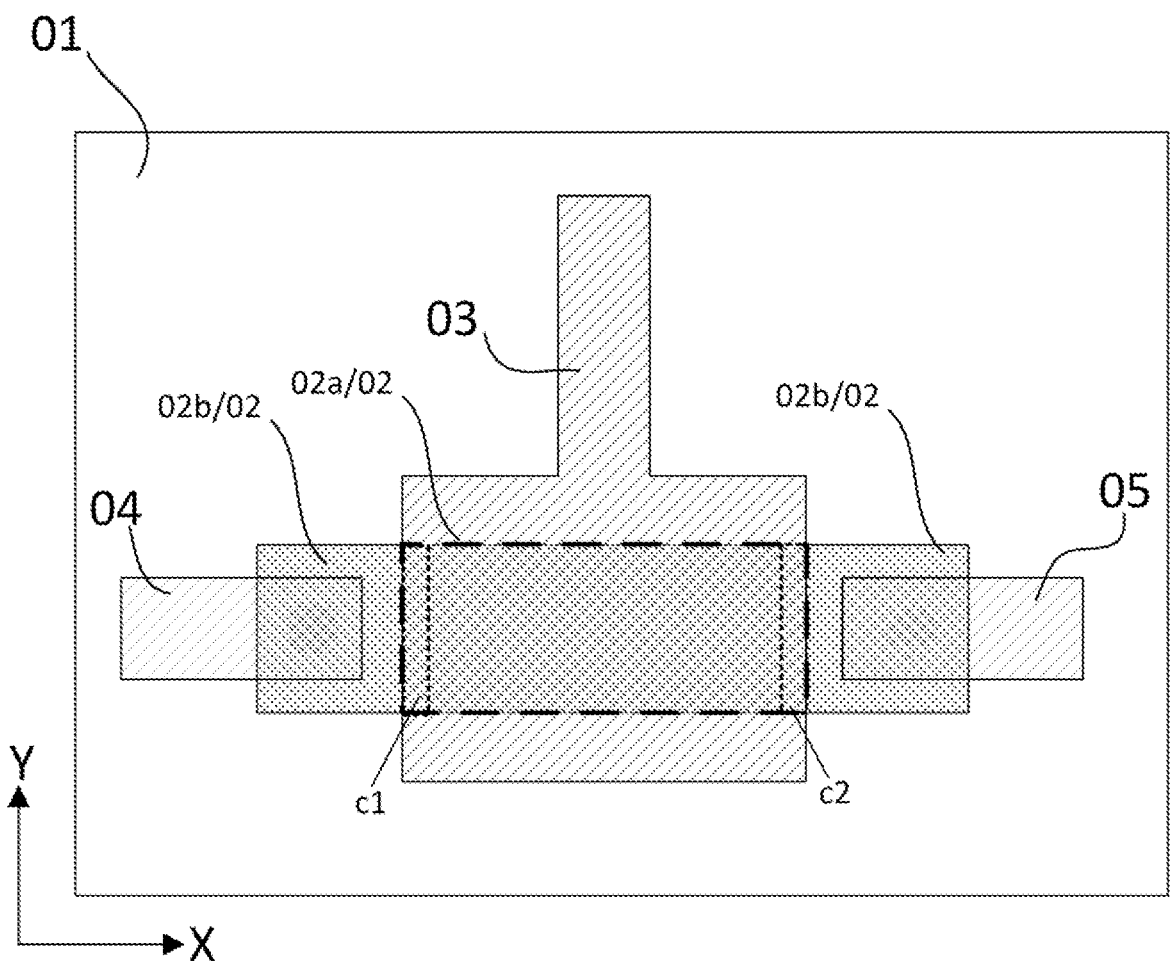
FIG. 1 is a schematic diagram illustrating a structure of a thin film transistor in the related art.

In order to enable one of ordinary skill in the art to better understand the technical solutions of the present disclosure, the present disclosure will be further described in detail below with reference to the accompanying drawings and specific embodiments.

Unless defined otherwise, technical or scientific terms used herein shall have the ordinary meaning as understood by one of ordinary skill in the art to which this disclosure belongs. The use of "first", "second", and the like in the present disclosure is not intended to indicate any order, quantity, or importance, but rather serves to distinguish one element from another. Also, the term "a", "an", "the" or the like does not denote a limitation of quantity, but rather denotes the presence of at least one. The word "comprising", "comprises", or the like means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

In the present disclosure, two structures "in a same layer" means that the two structures are formed of a same material layer, and thus the two structures are in the same layer in the stacking relationship, but it does not represent that the two structures are equidistant from a base substrate, nor that structures of other layers between the two structures and the base substrate are completely the same as each other.

The present disclosure will be described in more detail below with reference to the accompanying drawings. The same elements are denoted by like reference characters throughout the various figures. For purposes of clarity, the various features in the drawings are not drawn to scale. Moreover, certain well-known elements may not be shown in the figures.

It should be noted that, in the present disclosure, any two of a first direction X, a second direction Y, and a third direction Z intersect with each other. In the present disclosure, it is taken as an example for description, that the first direction X and the second direction Y are perpendicular to each other in a plane where a base substrate is located, the first direction X is a horizontal direction, the second direction Y is a vertical direction, and the third direction Z is perpendicular to the plane where the base substrate is located. However, it does not limit the present disclosure.

In the related art, a driving circuit of a display panel includes a plurality of thin film transistors with different functions, such as a switching transistor, a driving transistor, a gate integrated circuit (GOA) transistor, etc., and requirements on width-to-length ratios of active layers of the thin film transistors with different functions are different from each other. For example, as the pixel density (PPI) of the display panel increases, the number of light-emitting pixels in a same area increases. However, under the condition that a total brightness remains the same, light-emitting luminance of a single pixel decreases, and thus the requirements on current through the driving transistor decrease, so that the width-to-length ratio of the driving transistor is required to be correspondingly decreased. For example, in a 55-inch 4K display panel, the width-to-length ratio of the driving transistor is 19 μm/8 μm, while in a 30-inch 4K display panel, the width-to-length ratio of the driving transistor is 12 μm/20 μm, and in a 5-inch mobile terminal display panel, the width-to-length ratio of the driving transistor is in a range of 5 μm/20 μm to 5 μm/25 μm. Meanwhile, for thin film transistors of other functions, such as a switching transistor and a GOA transistor, higher switching response speed and smaller area are still required, and thus the width-to-length ratios thereof are still required to be kept large. For example, the width-to-length ratio of the GOA transistor is 1200 μm/6 μm, the width-to-length ratio of the switching transistor is 20 μm/6 μm, and the lengths of the channel regions of the active layers of the thin film transistors of the various functions are different due to different requirements on width-to-length ratio.

Further, referring to FIG. 1, the thin film transistor includes a base substrate 01, an active layer 02 arranged on the base substrate 01, a gate 03 arranged on the active layer 02, and a source 04 and a drain 05 arranged on the gate 03. The active layer 02 is divided into a channel region and a conductorized region, the channel region is a region of the active layer 02 having an orthographic projection on the base substrate 01 overlapping an orthographic projection of the gate 03 on the base substrate, the conductorized region is a region of the active layer 02 having an orthographic projection on the base substrate 01 not overlapping an orthographic projection of the gate 03 on the base substrate. Accordingly, the active layer 02 includes a first part 02a located in the channel region and a second part 02b located in the conductorized region. Taking the active layer being a metal oxide active layer as an example, during a thin film transistor is manufactured, after a pattern of the active layer 02 is formed from a metal oxide, a part of the metal oxide of the active layer 02 in the conductorized region is subjected to a conductorized process, including steps of forming oxygen vacancies by dry-etching and breaking bonds, doping, gas treatment, forming a low-oxygen silicon oxide (SiOx) interlayer insulating layer, and the like, so that the second part 02b in the conductorized region is conductorized. That is, the conductivity of the second part 02b is greater than that of the first part 02a, the second part 02b is subsequently electrically connected to the source 04 and the drain 05. However, the first part 02a of the channel region is not treated, thereby maintaining the semiconductor characteristics. Here, since the carrier concentration of the second part 02b of the conductorized region is high, carriers are prone to diffuse to the first part 02a. For example, c1 and c2 in FIG. 1 indicate regions where carriers of the second part 02b diffuse, so that the semiconductor characteristics of the first part 02 are affected to some extent.

In this case, it is obvious that in the thin film transistor with a longer channel region, the diffusion area of the carrier in the conductorized region into the channel region is lower. In other words, the carrier in the conductorized region is difficult to diffuse into a middle region of the channel region, and a ratio of an area of the diffused edge region to a total area of the channel region is small, so that the threshold voltage Vth is stable. That is, the stability is good. But at the same time, the difference between carrier concentrations in various parts of the channel region of the active layer of the thin film transistor with a longer channel region is large, so that the positive bias temperature stability PBTS is poor. That is, the characteristic uniformity is poor. Accordingly, the thin film transistor with a shorter channel region has a higher carrier concentration, a lower oxygen content, and fewer acceptor defects in the channel region than those of the thin film transistor with the longer channel region, and therefore the thin film transistors with different lengths of channel regions are affected differently by the carrier diffusion in the conductorized region, resulting in different effects on the performances of the thin film transistors, and thus it is difficult to ensure uniformity and stability of characteristics of each thin film transistor in the same display panel.

Figure 2:
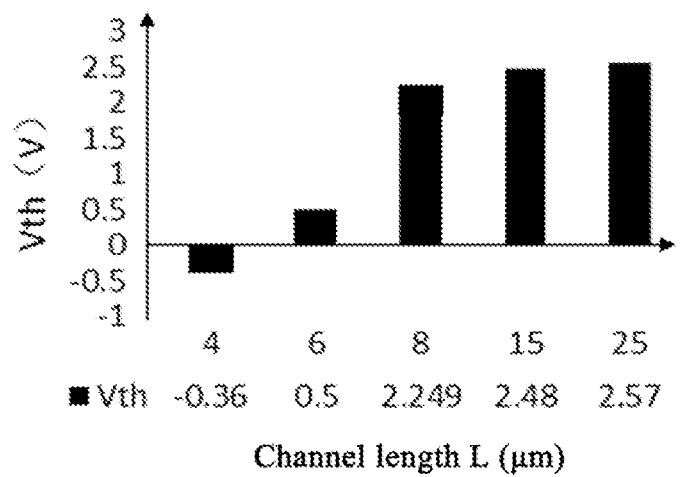
FIG. 2 is a graph showing a relationship between a threshold voltage and a length of a channel region of a thin film transistor.
Figure 3:
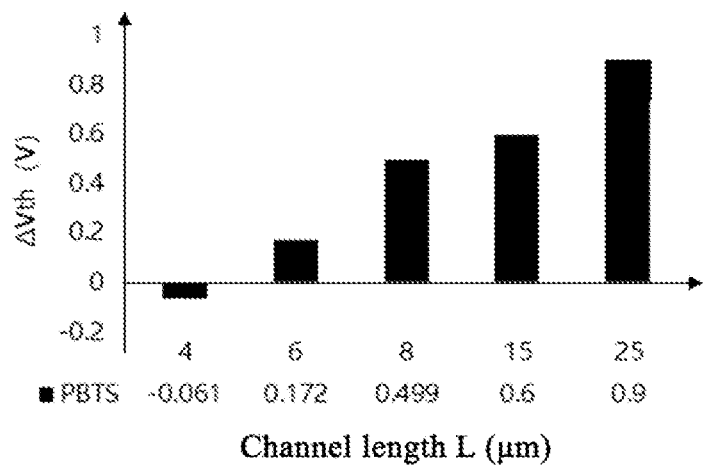
FIG. 3 is a graph showing a relationship between a threshold voltage shift amount and a length of a channel region of a thin film transistor.

FIG. 2 is a graph showing a relationship between a threshold voltage Vth and a length of a channel region L of the thin film transistor shown in FIG. 1, and FIG. 3 is a graph showing a relationship between a threshold voltage shift ΔVth and a length of a channel region L of the thin film transistor. Referring to FIGS. 2 and 3, as can be seen from FIG. 2, in terms of stability, the longer L is, the more stable Vth is; as can be seen from FIG. 3, in terms of characteristic uniformity, when L is longer, the drift of ΔVth is larger. Generally, ΔVth required by a driving transistor with a longer channel region is within 0.5V. Obviously, the thin film transistor in the related art is difficult to meet the requirements, and it is difficult to also ensure the uniformity and stability of the characteristics of the thin film transistor on the basis of ensuring the length of L.

In order to solve the above problem, in a first aspect, an embodiment of the present disclosure provides a thin film transistor including a base substrate, and an active layer, a gate, a source, and a drain arranged on the base substrate.

Specifically, the active layer includes a first part and a second part, the conductivity of the second part is greater than that of the first part, an orthographic projection of the gate on the base substrate covers an orthographic projection of the first part on the base substrate, and the orthographic projection of the gate on the base substrate does not overlap an orthographic projection of the second part on the base substrate. That is, the first part is a part located in the channel region of the active layer, the second part is a part located in the conductorized region of the active layer, and the source and the drain are each electrically connected to the second part. The first part of the active layer includes a plurality of first sub-parts, and two sides of any first sub-part in a trend direction of the active layer are connected to the second parts, respectively.

During the thin film transistor is manufactured, after a pattern of the active layer is formed, a part of the active layer in the conductorized region (i.e., the second part) is subjected to a conductorized process, including the steps of forming oxygen vacancies by dry etching and breaking bonds, doping, gas treatment, forming low-oxygen SiOx interlayer insulating layer, and the like, so that the second part of the conductorized region is conductorized. That is, the conductivity of the second part is greater than that of the first part. However, the first part of the channel region is not treated, thereby maintaining the semiconductor characteristics. In the thin film transistor according to the present disclosure, since the first part of the active layer located in the channel region is divided into a plurality of first sub-parts, and a sum of lengths of the plurality of first sub-parts is the same as a length of the channel region of the undivided first part, the length of the channel region is not affected, thereby ensuring the stability of the thin film transistor with this length of the channel region (i.e., Vth is stable). Moreover, since each of the first sub-parts is connected to the second part of the active layer located in the conductorized region, carriers in the second part with higher carrier concentration can be diffused through a connection part between the with the second part and a corresponding one of the plurality of first sub-parts, so that carriers in the second parts can be uniformly diffused into the plurality of first sub-parts, the difference between carrier concentrations at various positions of the first part is lower, and the characteristic uniformity (namely, the PBTS drift is small) of the thin film transistor can be ensured.

In some examples, the active layer of the thin film transistor may be made of various materials, for example, the active layer is a metal oxide active layer, an amorphous silicon active layer, or the like. The metal oxide is, for example, Indium Gallium Zinc Oxide (IGZO). For convenience of description, it is taken as an example for description that the active layer is an IGZO active layer, which is, however, not intended to limit the present disclosure.

In the present disclosure, the thin film transistor may be of a top gate type, that is, the gate is located on a side of the active layer away from the base substrate; alternatively, the thin film transistor may be of a bottom gate type, that is, the gate is located on a side of the active layer close to the base substrate, which are not limited herein. For convenience of description, the thin-film transistor being of the top gate type is taken as an example for description below.

In the thin film transistor according to the present disclosure, the first part and the second part may have various implementations, which are exemplified below.

In the accompanying drawings of the present disclosure, for convenience of illustrating the positional relationship between the structures of the respective layers, some of the layers are drawn transparent. However, it does not denote that the layers are actually transparent layers. That is, the materials of the layers are not limited.

A First Embodiment

Figure 4:
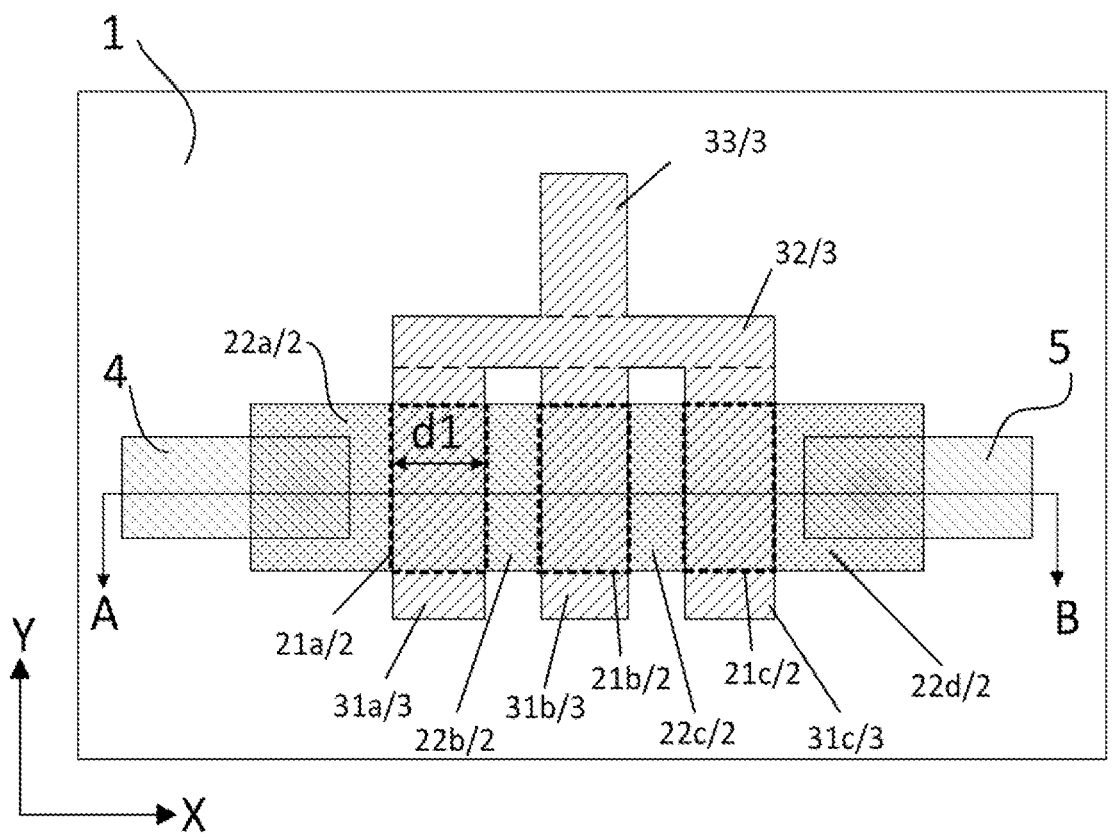
FIG. 4 is a schematic diagram illustrating a structure of a thin film transistor according to a first embodiment of the present disclosure.
Figure 5:
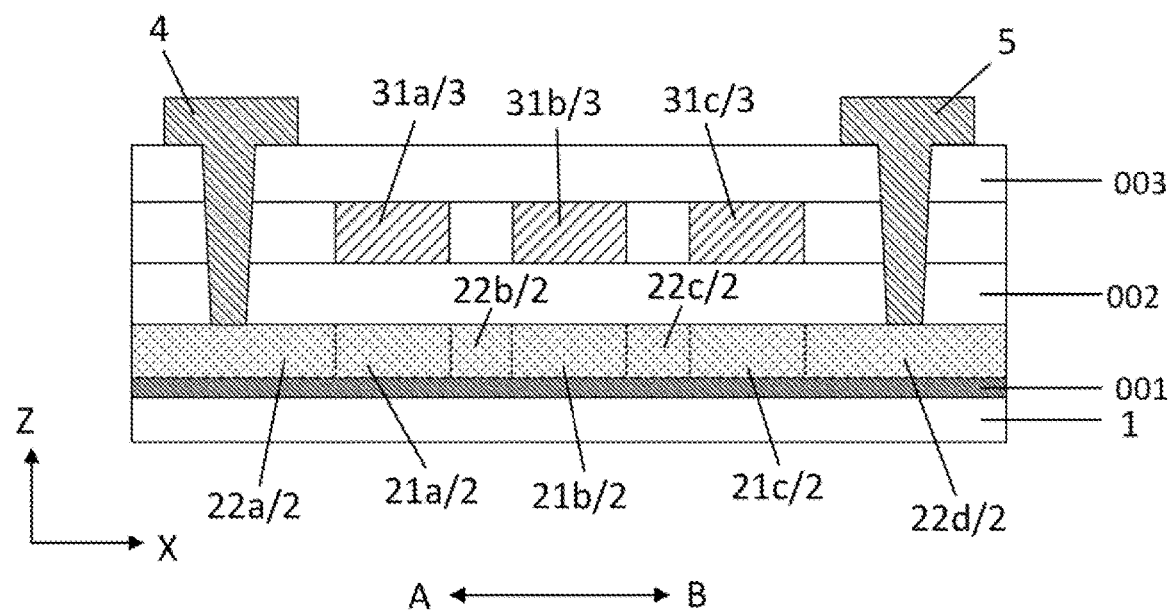
FIG. 5 is a schematic diagram illustrating a structure of layers of a thin film transistor taken along a line A-B in FIG. 4.
Figure 6:
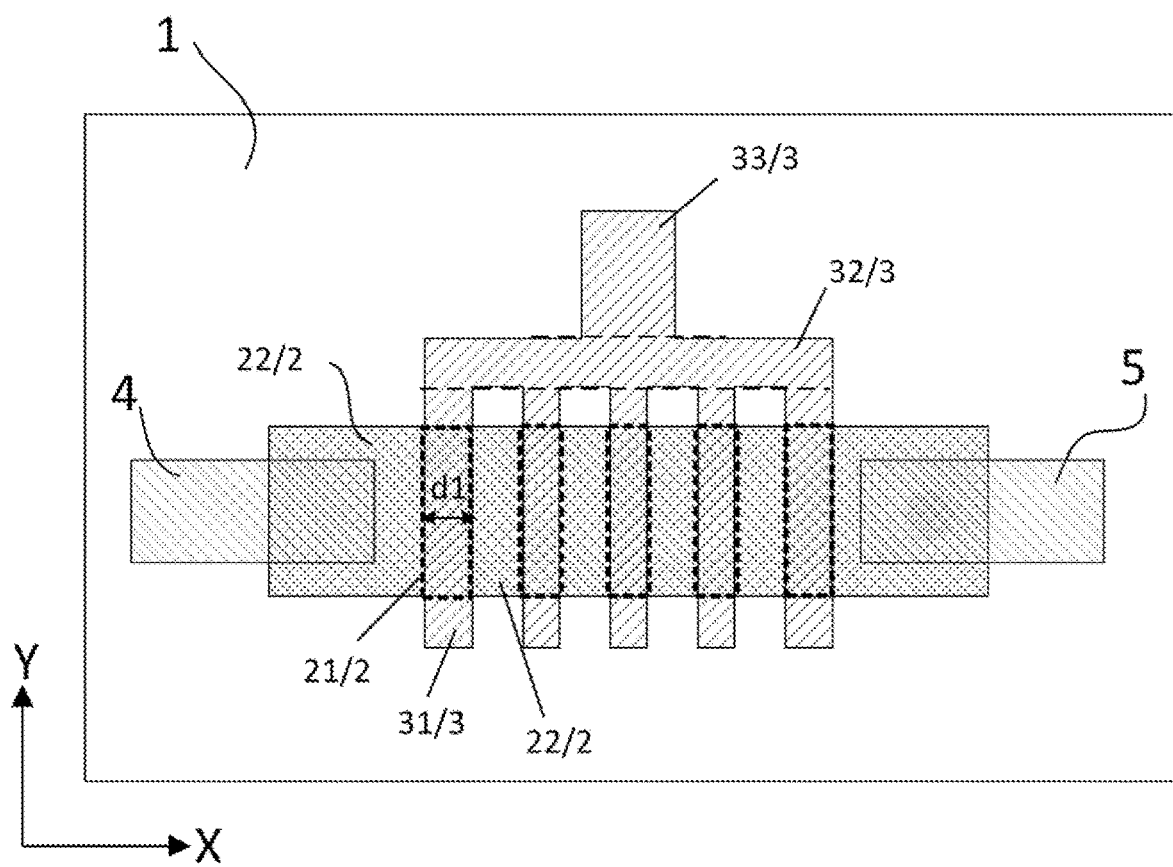
FIG. 6 is a schematic diagram illustrating a structure of another thin film transistor according to a first embodiment of the present disclosure.

Referring to FIGS. 4 to 6, where FIGS. 4 and 6 are schematic diagrams each illustrating an exemplary structure of the thin film transistor according to the present embodiment, and FIG. 5 is a schematic diagram illustrating a structure of layers of a thin film transistor taken along a line A-B in FIG. 4.

The thin film transistor according to the present embodiment includes a base substrate 1, and an active layer 2, a gate 3, a source 4, and a drain 5 arranged on the base substrate 1. A buffer layer 001 is arranged between the base substrate 1 and the active layer 2. A gate insulating layer 002 is arranged between the active layer 2 and the gate 3. An interlayer insulating layer 003 is arranged directly between the gate 3 and a layer where the source 4 and the drain 5 are located. The source 4 and the drain 5 are each connected to the active layer 2 (specifically, the second parts) through vias penetrating through the interlayer insulating layer 003 and the gate insulating layer 002. The active layer 2 includes a first part and a second part. The first part includes a plurality of first sub-parts, for example, as denoted by 21a, 21b, 21c in FIG. 4. The second part includes a plurality of second sub-parts, for example, as denoted by 22a, 22b, 22c, 22d in FIG. 4. The conductivity of the second part is greater than that of the first part, an orthographic projection of the gate 3 on the base substrate 1 covers an orthographic projection of the first part (i.e., the plurality of first sub-parts) on the base substrate 1, and the orthographic projection of the gate 3 on the base substrate 1 does not overlap an orthographic projection of the second part (i.e., the plurality of second sub-parts) on the base substrate. That is, the first part is a part located in the channel region of the active layer 2, and the second part is a part located in the conductorized region of the active layer 2. The source 4 and the drain 5 are arranged in a same layer, the source 4 is arranged in a different layer from the active layer 2 and the gate 3, and the drain 5 is arranged in a different layer from the active layer 2 and the gate 3. The source 4 and the drain 5 are each connected to the second part of the active layer 2. That is, the source 4 and the drain 5 are connected to parts of the conductorized region of the active layer 2, respectively.

The active layer 2 extends along a first direction X, which is the trend direction of the active layer 2. The gate 3 includes at least two sub-gates at intervals along the first direction X, and the number of the sub-gates may be set as required. For example, in FIG. 4, the gate 3 includes three sub-gates (as denoted by 31a, 31b, and 31c in FIG. 4), and in FIG. 6, the gate 3 includes five sub-gates 31. A sum of lengths d1 of the sub-gates along the first direction X is a length of a channel region of the thin film transistor. The length d1 of each sub-gate may be the same or different, and a distance between any two adjacent sub-gates in the plurality of sub-gates may be the same or different, which is not limited herein. A part of the active layer 2 in a region defined by an orthographic projection of a sub-gate on the active layer 2 is a first sub-part, for example, a part of the active layer in a region of a rectangular dashed frame in FIGS. 4 and 6 is shown to be a first sub-part. A part of the active layer in a region between any two adjacent first sub-parts is a second sub-part, for example, the second sub-part as denoted by 22b and 22c in FIG. 4. Two sides of any one of the first sub-parts in the first direction X are each connected to one of the second sub-parts. For example, the leftmost first sub-part 21a in the drawing is connected to the second sub-parts 22a and 22b located on two sides of the first sub-part 21a, respectively. In such a manner that the plurality of first sub-parts and the plurality of second sub-parts are alternately arranged and interconnected along the first direction X, both sides of any one of the first sub-parts in the first direction X are connected to the second sub-parts, respectively. In addition, both of the sub-part at the head and the sub-part at the tail are the second sub-parts (for example, the leftmost second sub-parts 22a and the rightmost second sub-parts 22d, as shown in FIG. 4). One of the source 4 and the drain 5 is electrically connected to the second sub-part at the head (for example, 22a), and the other of the source 4 and the drain 5 is connected to the second sub-part at the tail (for example, 22d).

In some examples, the gate 3 further includes a connection electrode 32, and one end of each of at least two sub-gates is connected to the connection electrode 32. An orthographic projection of the connection electrode 32 on the base substrate 1 does not overlap an orthographic projection of the active layer 2 on the base substrate 1. The connection electrode 32 extends along the first direction X, and the at least two sub-gates extend along a second direction Y, and the first direction X intersects with the second direction Y. In FIGS. 4 and 6, the first direction X is perpendicular to the second direction Y. The gate 3 further includes a gate connection line 33, and the gate connection line 33 has one end connected to the connection electrode 32 and the other end connected to a voltage power supply circuit (not shown in the drawings).

In the present embodiment, the gate 3 is divided into a plurality of sub-gates arranged at intervals, so that a part of the active layer 2 covered by the sub-gates remains as a semiconductor, a part of the active layers uncovered by the sub-gates and a part of the active layers at a junction between the covered and uncovered parts are conductorized, thereby forming a plurality of first and second sub-parts alternately arranged and interconnected and arranged side by side in the first direction. Each first sub-part connects two of the second sub-parts together, so that carriers in the plurality of second sub-parts can diffuse to the first sub-part connected thereto, the carrier concentration differences in the plurality of first sub-parts are kept consistent, and the characteristic uniformity of the thin film transistor can be ensured (namely the PBTS drift amount is small; in addition, the sum of the lengths of the plurality of first sub-parts in the first direction satisfies the requirements on the length of the channel region of the thin film transistor, thereby, the stability of the thin film transistor (i.e., Vth is stable) with this length of the channel region can be ensured.

Referring to FIG. 7, FIG. 7 shows a table of ID-VG test data of three thin film transistors, where each of thin film transistors numbered ①, ②, and ③ has a width-to-length ratios of 20 μm:24 μm, and a length of a channel region of 24 μm. The thin film transistor numbered ① is the thin film transistor shown in FIG. 1; the thin film transistor numbered ② is the thin film transistor shown in FIG. 4, where the first part of the active layer of the thin film transistor includes three first sub-parts with a length of 8 μm, and the length of the channel region of the active layer of the thin film transistor is 3×8 μm; and for the thin film transistor numbered ③, the first part of the active layer of this thin film transistor includes four first sub-parts with a length of 6 μm, and the length of the channel region of the active layer of the thin film transistor is 4×6 μm. The normalized on-state currents Ion of the thin film transistors numbered ① to ③ are 26.8 μA, 26.2 μA and 27.0 μA, respectively. The loading time in the table indicates the loading time (unit in second) of the positive bias temperature stability test, and the values in each column under the loading time are the threshold voltages Vth of the corresponding numbered thin film transistors, respectively, and the last column is the threshold voltage drift. It can be seen that the thin film transistors numbered 2 and 3 according to the present embodiment have more stable threshold voltages and lower drift, compared with the thin film transistor numbered ①. Therefore, the PBTS stability of the thin film transistors according to the present embodiment is verified under the condition that the length of the channel region is unchanged.

A Second Embodiment

Referring to FIGS. 8 and 9, where FIGS. 8 and 9 are schematic diagrams each illustrating an exemplary structure of a thin film transistor according to the embodiment.

The thin film transistor according to the present embodiment includes a base substrate 1, and an active layer 2, a gate 3, a source 4, and a drain 5 arranged on the base substrate 1. The active layer 2 includes a first part and a second part. The first part includes a plurality of first sub-parts, for example, as denoted by 21a, 21b, 21c, and 21d in FIG. 8. The second part includes a plurality of second sub-parts, for example, as denoted by 22a, 22b, 22c, 22d, and 22e in FIG. 8. The conductivity of the second part is greater than that of the first part, an orthographic projection of the gate 3 on the base substrate 1 covers an orthographic projection of the first part (i.e., the plurality of first sub-parts) on the base substrate 1, and the orthographic projection of the gate 3 on the base substrate 1 does not overlap an orthographic projection of the second part (i.e., the plurality of second sub-parts) on the base substrate. That is, the first part is a part located in the channel region of the active layer 2, and the second part is a part located in the conductorized region of the active layer 2.

The active layer 2 extends along a first direction X, which is a trend direction of the active layer 2. The gate 3 is provided with at least one hollowed-out part k1. Each part of the active layer 2 in a region defined by an orthographic projection of at least one hollowed-out part k1 on the active layer 2 is a second sub-part, for example, the second sub-parts denoted by 22b, 22c and 22d in FIG. 8, or the second sub-parts denoted by 22b in FIG. 9. Two sides of the second sub-part of the active layer 2 in the region defined by the orthographic projection of any one hollowed-out part k1 on the active layer 2 in the trend direction of (e.g., the first direction) of the active layer 2 are each connected to one of the first sub-parts. For example, the second sub-part 22b in FIG. 9 is connected to the first sub-part 21a and the first sub-part 21b on the left and right sides of the second sub-part 22b, respectively.

In some examples, referring to FIG. 8, the gate 3 is provided with a plurality of hollowed-out parts k1 at intervals along the first direction X. A part of the active layer 2 in the region defined by the orthographic projection of any one hollowed-out part k1 of the plurality of hollowed-out parts k1 on the active layer 2 is a second sub-part, for example, the second sub-parts denoted by 22b, 22c and 22d in FIG. 8. Two sides of each of these second sub-parts in the first direction X are each connected to one of the first sub-parts. For example, the second sub-part 22b in FIG. 8 is connected to a first sub-part 21a and a first sub-part 21b on the left and right sides of the second sub-part 22b, respectively. In such a manner that the hollowed-out parts are arranged in the gate 3 to divide the active layer 2 into a plurality of first sub-parts and a plurality of second sub-parts alternately arranged and interconnected along the first direction X, both sides of any one of the second sub-parts along the first direction X are connected to the first sub-parts, respectively. In addition, both the sub-part at the head and the sub-part at the tail are second sub-parts (for example, the leftmost second sub-part 22a and the rightmost second sub-part 22c as shown in FIG. 9). One of the source 4 and the drain 5 is electrically connected to the second sub-part at the head (e.g., 22a), and the other of the source 4 and the drain 5 is connected to the second sub-part at the tail (e.g., 22c).

In some examples, a distance between any two adjacent hollowed-out parts k1 in the plurality of hollowed-out parts k1 in the gate 3 may be the same or different.

In some examples, an orthographic projection of each hollowed-out part k1 in the gate 3 on the base substrate 1 has the same shape and the same area. The hollowed-out part k1 may have various shapes, such as a rectangle, a circle, an ellipse, or the like. For the embodiment in which the hollowed-out parts k1 are circular or elliptical, referring to FIG. 9, the length of the channel region of the thin film transistor is a sum of a length d2 of an overlapping region between orthographic projections of the gate 3 and the active layer 2 on the base substrate 1 in the first direction X minus a length (or diameter) d3 of an orthographic projection of the at least one hollowed-out part k1 on the base substrate 1 in the first direction X. As for the embodiment where the hollowed-out part k1 is rectangular, referring to FIG. 8, the length of the channel region of the thin film transistor is a sum of lengths d1 of the first sub-parts d1 in the first direction X.

In the present embodiment, the gate 3 is provided with at least one hollowed-out part 1, so that a part of the active layer 2 in a region of a non-hollowed-out part remains as a semiconductor, a part of the active layer 2 in the region of the hollowed-out part k1 and a part of the active layer 2 not covered by the gate 3 are conductorized, so as to form the plurality of first and second sub-parts alternately arranged and interconnected and arranged side by side in the first direction X. Each second sub-part connects two of the first sub-parts together, so that carriers in the plurality of second sub-parts can diffuse to the first sub-part connected thereto, the carrier concentration differences in the plurality of first sub-parts are kept consistent, and the characteristic uniformity of the thin film transistor can be ensured (namely the PBTS drift amount is small; in addition, the sum of the lengths of the plurality of first sub-parts in the first direction satisfies the requirements on the length of the channel region of the thin film transistor, thereby, the stability of the thin film transistor (i.e., Vth is stable) with this length of the channel region can be ensured.

A Third Embodiment

Figure 10:
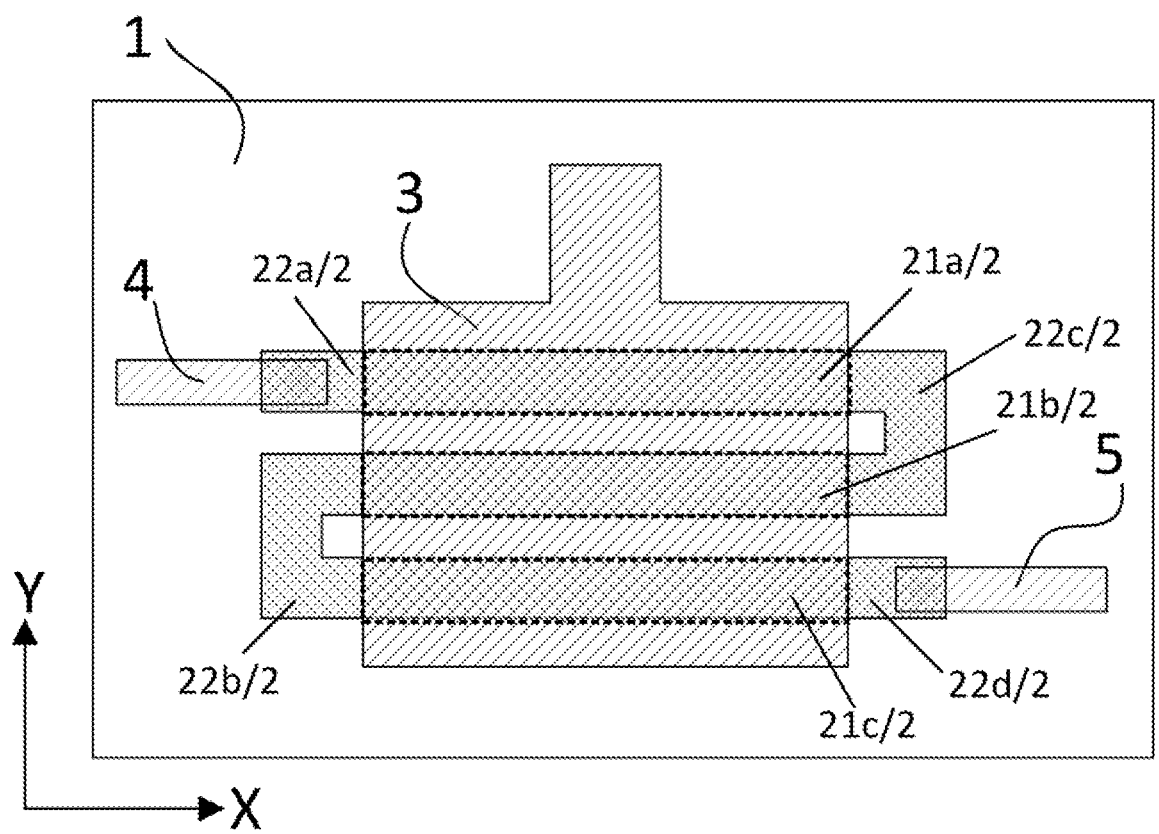
FIG. 10 is a schematic diagram illustrating a structure of a thin film transistor according to a third embodiment of the present disclosure.
Figure 11:
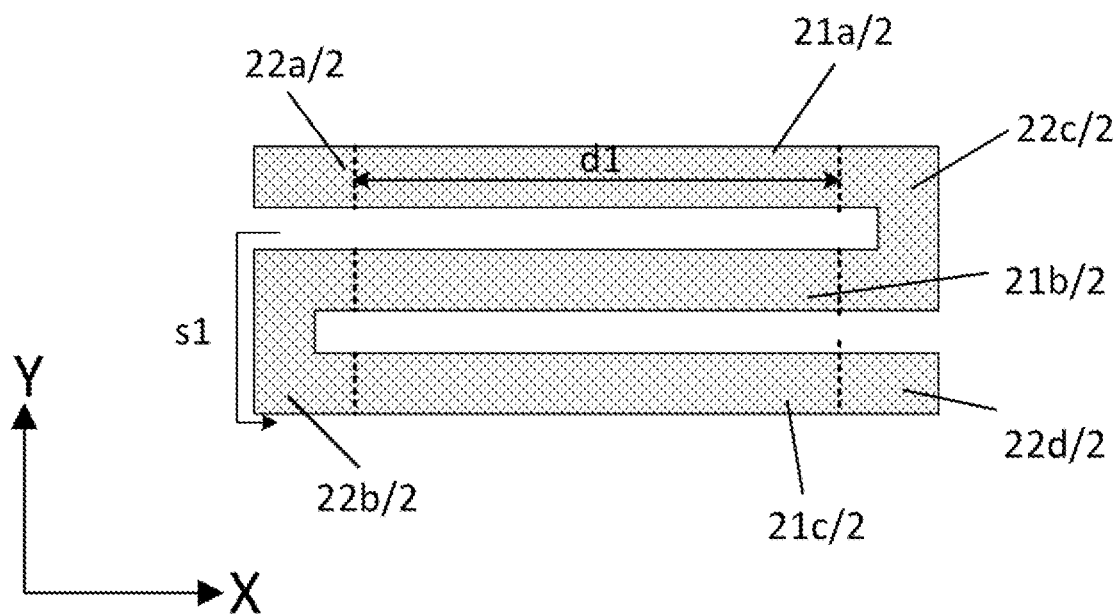
FIG. 11 is a schematic diagram illustrating a structure of an active layer of a thin film transistor according to a third embodiment the present disclosure.
Figure 12:
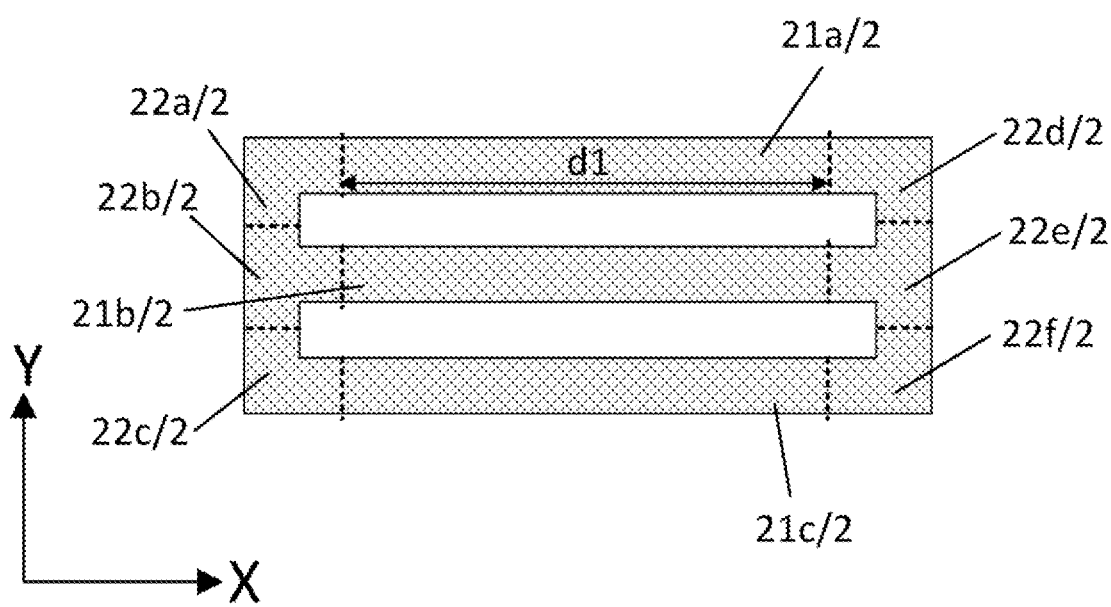
FIG. 12 is a schematic diagram illustrating a structure of an active layer of another thin film transistor according to a third embodiment the present disclosure.

Referring to FIGS. 10 to 12, where FIG. 10 is a schematic diagram illustrating an exemplary structure of a thin film transistor according to the present embodiment; FIG. 11 is a schematic diagram illustrating a structure of an active layer of the thin film transistor in FIG. 10; and FIG. 12 is a schematic diagram illustrating another exemplary structure of an active layer of the thin film transistor according to the present embodiment.

The thin film transistor according to the present embodiment includes a base substrate 1, and an active layer 2, a gate 3, a source 4, and a drain 5 arranged on the base substrate 1. The active layer 2 includes a first part and a second part. The first part includes a plurality of first sub-parts, for example, as denoted by 21a, 21b, and 21c in FIGS. 11, and 21a, 21b, 21c in FIG. 12. The second part includes a plurality of second sub-parts, for example, as denoted by 22a, 22b, 22c, and 22d in FIGS. 11, and 22a, 22b, 22c, 22d, 22e, and 22f in FIG. 12. The conductivity of the second part is greater than that of the first part, an orthographic projection of the gate 3 on the base substrate 1 covers an orthographic projection of the first part (i.e., the plurality of first sub-parts) on the base substrate 1, and the orthographic projection of the gate 3 on the base substrate 1 does not overlap an orthographic projection of the second part (i.e., the plurality of second sub-parts) on the base substrate. That is, the first part is a part in the channel region of the active layer 2, and the second part is a part in the conductorized region of the active layer 2.

In this case, a trend direction of the active layer 2 may include a plurality of directions. Specifically, during the trend direction of the active layer 2 at a specific position is defined, the trend direction of this part is the extending direction of the part of the active layer 2. For example, referring to FIG. 11, the trend direction of the first sub-part 21a is the first direction, and the trend direction of the second sub-part 22b is the trend direction denoted by the arrow SI in the drawing.

In some examples, referring to FIG. 11, a plurality of first sub-parts (e.g., 21a, 21b, and 21c in FIG. 11) are arranged at intervals along a second direction Y, each of the plurality of first sub-parts extends along a first direction X, and the first direction X intersects with the second direction Y. Taking it as an example that the first direction X is a horizontal direction, the second direction is a vertical direction a, and the first direction X and the second direction are perpendicular to each other, the plurality of first sub-parts extend along the horizontal direction and are arranged at intervals along the vertical direction, and a sum of lengths d1 of the first sub-parts in the first direction X is the length of the channel region of the thin film transistor.

Further, the plurality of second sub-parts (e.g., 22a, 22b, 22c, 22d in FIG. 11) are divided into a first group of second sub-parts and a second group of second sub-parts, and the first group of second sub-parts and the second group of second sub-parts are arranged on two sides (i.e., left and right sides in FIG. 11) of the plurality of first sub-parts in the first direction X, respectively. Each of the second sub-parts in the first group of second sub-parts is connected to a first side of one corresponding first sub-part, and each of the second sub-parts in the second group of second sub-parts is connected to a second side of the first sub-part. In addition, different second sub-parts are connected to different first sub-parts, respectively. Taking FIG. 11 as an example, the first group of second sub-parts include the second sub-part 22a and the second sub-part 22b, and the second group of second sub-parts include the second sub-part 22b and the second sub-part 22d. The first group of second sub-parts are arranged on and connected to the left sides of the three first sub-parts, respectively; and the second group of second sub-parts are arranged on and connected to the right sides.

In some examples, referring to FIG. 11, the plurality of first sub-parts and the plurality of second sub-parts are connected to each other, to form a polygonal line, and an extending direction of each line segment of the polygonal line is the trend direction of the part of the active layer 2.

Referring to FIGS. 11 and 12, in comparison between the active layers 2 shown in the two figures, the first group of the second sub-parts may be arranged at intervals (as shown in FIG. 11), and the first group of the second sub-parts may alternatively be sequentially connected together to have a one-piece structure (as shown in FIG. 12). Similarly, the second group of the second sub-parts may be arranged at intervals (as shown in FIG. 11), and the second sub-parts of the second group may alternatively be sequentially connected together to have a one-piece structure (as shown in FIG. 12). In either of the active layers shown in FIG. 11 or 12, both sides of each of the first sub-parts in the extending direction of the first sub-part itself are each connected to the second sub-part.

In the present embodiment, the gate 3 may have a shape consistent with that of the first part, and may also be of a rectangle, as long as the gate 3 can cover the first part, which is not limited herein.

In the present embodiment, the first part is divided into a plurality of first sub-parts arranged at intervals, the plurality of second sub-parts are divided into two groups which are arranged on two sides of the first sub-parts, respectively, and two sides of each of the first sub-parts in the extending direction of the first sub-part itself are each connected to the second sub-part, so that carriers in each of the plurality of second sub-parts can diffuse to the first sub-part connected thereto, so that the carrier concentration differences in the plurality of first sub-parts are kept uniform, the characteristic uniformity of the thin film transistor (i.e., the PBTS drift amount is small) can be ensured. In addition, the sum of the lengths of the plurality of first sub-parts in the first direction satisfies the requirements on the length of the channel region of the thin film transistor, so that the stability of the thin film transistor with this length of the channel region (i.e., Vth is stable) can be ensured.

Alternatively, in the thin film transistor according to the present disclosure, the first part and the second part also have other implementations, and the above first to third embodiments show only exemplary structures and are not limited herein.

In some examples, the orthographic projections of the first sub-parts on the base substrate 1 are the same in shape and area, and/or the distance between any two adjacent first sub-parts of the plurality of first sub-parts is the same. In other words, the plurality of first sub-parts are arranged at equal intervals. Similarly, in some examples, the orthographic projections of the second sub-parts on the base substrate 1 are the same in shape and area, and/or the distance between any two adjacent second sub-parts of the plurality of second sub-parts is the same. In other words, the plurality of second sub-parts are arranged at equal intervals. With such an arrangement, the diffusion of carriers from the second sub-part to the first sub-part can be more uniform, thereby the uniformity of characteristics of the thin film transistor can be higher.

In some examples, the first and second parts of the active layer 2 may be formed to have a one-piece structure. Similarly, the plurality of first sub-parts and the plurality of second sub-parts may be formed to have a one-piece structure.

In a second aspect, the present disclosure further provides a display panel including a plurality of the above thin film transistors, which may serve as a switching transistor, a driving transistor, a gate integrated circuit transistor, and the like. The display panel may be any product or component with a display function, such as a mobile phone, a tablet computer, a television, a monitor, a notebook computer, a digital photo frame, a navigator, or the like. Other essential components of the display panel are understood by one of ordinary skill in the art, and are not described herein nor should they be construed as limiting the present disclosure.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without departing from the spirit and essence of the present disclosure, and such modifications and improvements are also considered to be within the protection scope of the present disclosure.

What is claimed is:

1. A thin film transistor, comprising: a base substrate, and an active layer and a gate on the base substrate,
    wherein the active layer comprises a first part and a second part, a conductivity of the second part is greater than a conductivity of the first part; an orthographic projection of the gate on the base substrate covers an orthographic projection of the first part on the base substrate, and the orthographic projection of the gate on the base substrate does not overlap an orthographic projection of the second part on the base substrate; and
    the first part comprises a plurality of first sub-parts, and two sides of any one of the plurality of first sub-parts in a trend direction of the active layer are each connected to the second part.

2. The thin film transistor according to claim 1, wherein the second part comprises a plurality of second sub-parts; and both sides of any one of the plurality of first sub-parts in the trend direction of the active layer are each connected to a corresponding one of the plurality of second sub-parts.

3. The thin film transistor according to claim 2, wherein the plurality of first sub-parts and the plurality of second sub-parts are alternately arranged and interconnected along the trend direction of the active layer, and each of two sub-parts respectively at the head and the tail along the trend direction of the active layer is the second sub-part.

4. The thin film transistor according to claim 3, wherein the active layer extends in a first direction; the gate comprises at least two sub-gates arranged at intervals along the first direction, and
    a part of the active layer in a region of an orthographic projection of each of the at least two sub-gates on the active layer is a corresponding one of the plurality of first sub-parts; a part of the active layer in a region between any two adjacent first sub-parts is a corresponding one of the plurality of second sub-parts; and two sides of any one of the plurality of first sub-parts in the first direction are each connected to a corresponding one of the plurality of second sub-parts.

5. The thin film transistor according to claim 4, wherein the gate further comprises a connection electrode, and one end of each of the at least two sub-gates is connected to the connection electrode; an orthographic projection of the connection electrode on the base substrate does not overlap the orthographic projection of the active layer on the base substrate,
    wherein the connection electrode extends along the first direction, the at least two sub-gates extend along a second direction, and the first direction intersects with the second direction.

6. The thin film transistor according to claim 2, wherein the gate is provided with at least one hollowed-out part, and a part of the active layer in a region of an orthographic projection of each of the at least one hollowed-out part on the active layer is a corresponding one of the plurality of second sub-parts, and two sides of this second sub-part in the trend direction of the active layer are each connected to a corresponding one of the plurality of first sub-parts.

7. The thin film transistor according to claim 3, wherein the active layer extends in a first direction; the gate is provided with a plurality of hollowed-out parts arranged at intervals along the first direction, a part of the active layer in a region of an orthographic projection of each of the plurality of hollowed-out parts on the active layer is a corresponding one of the plurality of second sub-parts, and two sides of this second sub-part in the trend direction of the active layer are each connected to a corresponding one of the plurality of first sub-parts.

8. The thin film transistor according to claim 7, wherein a distance between any two adjacent ones of the plurality of hollowed-out parts is the same, and/or an orthographic projection of each of the plurality of hollowed-out parts on the base substrate has a same shape and a same area.

9. The thin film transistor according to claim 3, wherein the plurality of first sub-parts are arranged at intervals along a second direction, and the plurality of first sub-parts extend along a first direction, and the first direction intersects with the second direction; and
    the plurality of second sub-parts comprise a first group of second sub-parts and a second group of second sub-parts, on two sides of the plurality of first sub-parts in the first direction, respectively; each second sub-part in the first group of second sub-parts is connected to a first side of a corresponding one of plurality of first sub-parts, and each second sub-part in the second group of second sub-parts is connected to a second side of a corresponding one of the plurality of first sub-parts.

10. The thin film transistor according to claim 9, wherein the plurality of first sub-parts and the plurality of second sub-parts are connected together, to form a zigzag shape.

11. The thin film transistor according to claim 1, wherein orthographic projections of the plurality of first sub-parts on the base substrate have a same shape and a same area, and/or a distance between any two adjacent first sub-parts of the plurality of first sub-parts is the same.

12. The thin film transistor according to claim 2, wherein orthographic projections of the plurality of second sub-parts on the base substrate have a same shape and a same area, and/or a distance between any two adjacent second sub-parts of the plurality of second sub-parts is the same.

13. A thin film transistor according to claim 1, wherein the plurality of first parts and the plurality of second parts have a one-piece structure.

14. A thin film transistor according to claim 1, wherein the active layer is a metal oxide active layer.

15. The thin film transistor according to claim 1, wherein the thin film transistor further comprises a source and a drain on the base substrate, wherein the source and the drain are in a same layer, and are in a different layer from the active layer and the gate; and the source and the drain are each connected to the second part.

16. A display panel, comprising at least one thin film transistor according to claim 1.

17. The display panel according to claim 16, wherein the second part comprises a plurality of second sub-parts; and both sides of any one of the plurality of first sub-parts in the trend direction of the active layer are each connected to a corresponding one of the plurality of second sub-parts.

18. The display panel according to claim 17, wherein the plurality of first sub-parts and the plurality of second sub-parts are alternately arranged and interconnected along the trend direction of the active layer, and each of two sub-parts respectively at the head and the tail along the trend direction of the active layer is the second sub-part.

19. The display panel according to claim 18, wherein the active layer extends in a first direction; the gate comprises at least two sub-gates arranged at intervals along the first direction, and a part of the active layer in a region of an orthographic projection of each of the at least two sub-gates on the active layer is a corresponding one of the plurality of first sub-parts; a part of the active layer in a region between any two adjacent first sub-parts is a corresponding one of the plurality of second sub-parts; and two sides of any one of the plurality of first sub-parts in the first direction are each connected to a corresponding one of the plurality of second sub-parts.

20. The display panel according to claim 19, wherein the gate further comprises a connection electrode, and one end of each of the at least two sub-gates is connected to the connection electrode; an orthographic projection of the connection electrode on the base substrate does not overlap the orthographic projection of the active layer on the base substrate, wherein the connection electrode extends along the first direction, the at least two sub-gates extend along a second direction, and the first direction intersects with the second direction.

* * * * *